(12) United States Patent
Lin et al.

(10) Patent No.: US 8,389,396 B2
(45) Date of Patent: Mar. 5, 2013

(54) METHOD FOR MANUFACTURE OF INTEGRATED CIRCUIT PACKAGE SYSTEM WITH PROTECTED CONDUCTIVE LAYERS FOR PADS

(75) Inventors: Yaojian Lin, Singapore (SG); Haijing Cao, Singapore (SG); Qing Zhang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/233,402

(22) Filed: Sep. 15, 2011

(65) Prior Publication Data

US 2012/0003830 A1 Jan. 5, 2012

Related U.S. Application Data

(62) Division of application No. 11/694,907, filed on Mar. 30, 2007, now Pat. No. 8,026,593.

(51) Int. Cl.
*H01L 21/44* (2006.01)

(52) U.S. Cl. ........ 438/612; 438/598; 438/599; 438/618; 438/620; 257/700

(58) Field of Classification Search .................. 438/598, 438/599, 612, 618, 620, 622, 652, 669; 257/41, 257/700
See application file for complete search history.

(56) References Cited

U.S. PATENT DOCUMENTS

| | | | |
|---|---|---|---|
| 5,736,791 A | 4/1998 | Fujiki et al. | |
| 6,232,238 B1 | 5/2001 | Chang et al. | |
| 6,278,191 B1 | 8/2001 | Singh | |
| 6,682,659 B1 | 1/2004 | Cho et al. | |
| 6,779,711 B2 | 8/2004 | Edelstein et al. | |
| 7,105,379 B2 | 9/2006 | Tsao et al. | |
| 2004/0115934 A1 | 6/2004 | Broz et al. | |

*Primary Examiner* — Thanh V Pham
(74) *Attorney, Agent, or Firm* — Ishimaru & Associates LLP; Mikio Ishimaru

(57) ABSTRACT

A method for manufacture of an integrated circuit package system includes: providing an integrated circuit die having a contact pad; forming a protection cover over the contact pad; forming a passivation layer having a first opening over the protection cover with the first opening exposing the protection cover; developing a conductive layer over the passivation layer; forming a pad opening in the protection cover for exposing the contact pad having the conductive layer partially removed; and an interconnect directly on the contact pad and only adjacent to the protection cover and the passivation layer.

10 Claims, 4 Drawing Sheets

METHOD FOR MANUFACTURE OF INTEGRATED CIRCUIT PACKAGE SYSTEM WITH PROTECTED CONDUCTIVE LAYERS FOR PADS

CROSS-REFERENCE TO RELATED APPLICATION(S)

This is a divisional of U.S. patent application Ser. No. 11/694,907 filed Mar. 30, 2007, now U.S. Pat. No. 8,026,593.

TECHNICAL FIELD

The present invention relates generally to integrated circuit package system, and more particularly to integrated circuit package system having protected conductive layers.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Every new generation of integrated circuits with increased operating frequency, performance and the higher level of large-scale integration have underscored the need for back-end integrated circuit manufacturing to provide more solutions involving the integrated circuit itself.

Numerous technologies have been developed to meet these requirements. Some of the research and development strategies focus on new package technologies while others focus on improving the existing and mature package technologies. Both approaches may include additional processing of the integrated circuits to better match the targeted package.

The continued emphasis in the integrated circuit technology is to create improved performance integrated circuit devices at competitive prices. This emphasis over the years has resulted in increasing miniaturization of integrated circuit devices, made possible by continued advances of integrated circuit processes and materials in combination with new and sophisticated device designs.

Numerous integrated circuit designs are aimed for mixed-signal designs by incorporating analog functions. One of the major challenges in the creation of analog processing circuitry (using digital processing procedures and equipment) is that a number of the components that are used for analog circuitry are large in size and are therefore not readily integrated into integrated circuits. The main components that offer a challenge in this respect are capacitors and inductors, since both these components are, for typical analog processing circuits, of considerable size. In response to the demands for improved package performance and analog circuitry integration, packaging manufacturers may prepare the integrated circuit for packaging as well as provide analog circuitry integration onto the integrated circuit.

Although analog circuitry integration and processing support the miniaturization trend, other problems arise from this integration. For example, semiconductor or integrated circuit devices have pads exposed for connecting, such as wire bonding, to the package terminals, such as leads. Typically, analog circuitry integration or any additional device processing after the pad development damages the pad resulting in poor electrical contact, contact reliability, reduced yield, and increased cost.

Still thinner, smaller, and lighter package designs and mounting/connecting configurations have been adopted in response to continuing requirements for further miniaturization. At the same time, users are demanding integrated circuit packages that are more reliable under increasingly severe operating conditions.

Thus, a need still remains for an integrated circuit package system providing low cost manufacturing and improved yield for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacture of an integrated circuit package system including: providing an integrated circuit die having a contact pad; forming a protection cover over the contact pad; forming a passivation layer having a first opening over the protection cover with the first opening exposing the protection cover; developing a conductive layer over the passivation layer; forming a pad opening in the protection cover for exposing the contact pad having the conductive layer partially removed; and an interconnect directly on the contact pad and only adjacent to the protection cover and the passivation layer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
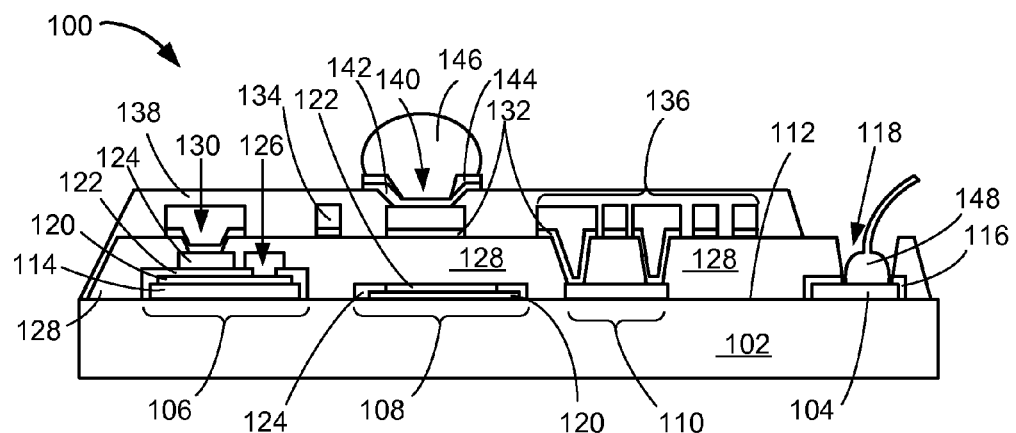
FIG. 1 is a cross-sectional view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a cross-sectional view of an integrated circuit package system 100 in an embodiment of the present invention. The cross-sectional view depicts an integrated circuit die 102 having contact pads 104, a first circuit element 106, a second circuit element 108, and a third circuit element 110 provided thereover.

For example, the contact pads 104 may function as input/output (IO) pads for the integrated circuit die 102. The first circuit element 106 is depicted as capacitor. The second circuit element 108 is depicted as a resistor. The third circuit element 110 is depicted as conductive trace or a redistribution trace. The contact pads 104, the first circuit element 106, the second circuit element 108, and the third circuit element 110 are preferably over an active side 112 of the integrated circuit die 102.

The contact pads 104 may be preferably formed with a first conductive layer 114, such as aluminum (Al), copper (Cu), gold (Au), or a metal alloy. The first conductive layer 114 is preferably not the first conducting layer of the semiconductor process used to manufacture the integrated circuit die 102. The first conductive layer 114 may be the last conducting layer of the semiconductor process used to manufacture the integrated circuit die 102.

A protection cover 116 preferably partially covers the contact pads 104 and exposes the contact pads 104 through pad openings 118. The protection cover 116 is preferably formed from a resistive layer 120. The protection cover 116 shields the contact pads 104 from further corrosive processing, such as wet etching, and prevents galvanic corrosion of the contact pads 104. Galvanic corrosion adversely affects the contact pads 104 causing pin holes. The resistive layer 120 may be formed by a number of high resistivity materials, such as nickel chromium (NiCr) or poly-silicon crystalline (poly-Si).

The first circuit element 106 preferably includes the first conductive layer 114, the resistive layer 120, an insulator layer 122, and a second conductive layer 124. The insulator layer 122 is preferably a dielectric layer or film, such as silicon nitride (SiN), tantalum pentoxide ($Ta_2O_5$), or hafnium oxide ($HfO_2$). The second conductive layer 124 is preferably aluminum (Al), copper (Cu), a metal alloy, or other conductive film.

The first circuit element 106 preferably has the resistive layer 120 over the first conductive layer 114 which is over the integrated circuit die 102. The insulator layer 122 partially covers the resistive layer 120 and the first conductive layer 114 of the first circuit element 106 and exposes the resistive layer 120 with an insulator opening 126. The second conductive layer 124 is preferably patterned over the insulator layer 122 not over the insulator opening 126 and over the insulator opening 126 connecting with the resistive layer 120.

The second circuit element 108 preferably includes the resistive layer 120, the insulator layer 122, and the second conductive layer 124. The second circuit element 108 preferably has the insulator layer 122 over the resistive layer 120 which is over the integrated circuit die 102. The second conductive layer 124 is patterned over the resistive layer 120 not covered by the insulator layer 122. The second conductive layer 124 is adjacent with and does not cover the insulator layer 122.

The third circuit element 110 preferably includes the second conductive layer 124. The third circuit element 110 is shown not contacting the second circuit element 108 or the resistive layer 120 over the contact pads 104. Also, the first circuit element 106 is shown not contacting the second circuit element 108.

A first passivation layer 128, such as polyimide, benzocyclobutene (BCB), polybenzoxazole (PBO), covers the active side 112 including the second circuit element 108. The first passivation layer 128 partially covers the first circuit element 106, the third circuit element 110, and the contact pads 104. The first passivation layer 128 also provides first openings 130 exposing the contact pads 104, the second conductive layer 124 of the first circuit element 106, and the third circuit element 110. The first passivation layer 128 is used to protect the underlying devices, such as the first circuit element 106 and the second circuit element 108, from penetration of mobile ions, moisture, transition metal (such as gold or silver), and other contaminations.

A third conductive layer 132 is preferably patterned over the first passivation layer 128. The third conductive layer 132 is preferably adjacent to and lining predetermined locations of the first openings 130. The third conductive layer 132 lines the first openings 130 over the first circuit element 106 and the third circuit element 110. The third conductive layer 132 is shown not over the contact pads 104.

The third conductive layer 132 also covers predetermined locations over the first passivation layer 128 not adjacent the first openings 130. The third conductive layer 132 is shown not completely covering the first passivation layer 128. The third conductive layer 132 may be formed from a number of different materials, such as chromium (Cr), tin (Ti), tin tungsten (TiW), tin nitride (TiN), tantalum (Ta), or tantalum nitride (TaN).

A fourth conductive layer 134 is preferably patterned over the third conductive layer 132. The fourth conductive layer 134 and the third conductive layer 132 may preferably provide a number of functions. For example, the first openings 130 lined with the third conductive layer 132 provide electrical vias connecting the fourth conductive layer 134 with the first circuit element 106 and the third circuit element 110.

Another example, the fourth conductive layer 134 over the third circuit element 110 and between the contact pads 104 and the third circuit element 110 may form a fourth circuit element 136, such as an inductor. The third conductive layer 132 and the fourth conductive layer 134 between the first circuit element 106 and the third circuit element 110 may function as redistribution layer.

The first passivation layer 128 serves as a stress buffer or protective coat for the integrated circuit die 102. The first passivation layer 128 also separates the fourth circuit element 136 from the substrate of the integrated circuit die 102 resulting in an increase in the Q value of the inductor.

A second passivation layer 138, such as polyimide, benzocyclobutene (BCB), polybenzoxazole (PBO), partially covers the first passivation layer 128 and the fourth conductive layer 134 with a second opening 140 exposing a portion of the fourth conductive layer 134 over the second circuit element 108. The second passivation layer 138 does not cover the pad openings 118 exposing the contact pads 104.

A fifth conductive layer 142 is preferably patterned over the second passivation layer 138 adjacent to and line the second opening 140. The fifth conductive layer 142 is over the fourth conductive layer 134 exposed in the second opening 140 and not completely covering the second passivation layer 138. The fifth conductive layer 142 may be formed from a number of different materials, such as chromium (Cr), tin (Ti), tin tungsten (TiW), tin nitride (TiN), tantalum (Ta), or tantalum nitride (TaN).

A sixth conductive layer 144 is preferably patterned over the fifth conductive layer 142. The sixth conductive layer 144 may be formed from a number of different materials, such as nickel vanadium (NiV), Cu, Cu/NiV, Au/Ni, or CrCu. The fifth conductive layer 142 and the sixth conductive layer 144 may preferably form the under bump metallization (UBM) for a first interconnect 146, such as sold bump, gold bump, or copper pillar. A second interconnect 148, such as a bond wire or a conductive pillar, is preferably attached to the contact pads 104 through the pad openings 118 in the first passivation layer 128 and the protection cover 116. The second interconnect 148 can be directly on each of the contact pads 104 without direct contact with the passivation layer 128.

The integrated circuit package system 100 may connect to the next system level (not shown), such as a printed circuit board or another integrated circuit device (not shown). Alternatively, the integrated circuit package system 100 may be further packaged.

Figure 2:
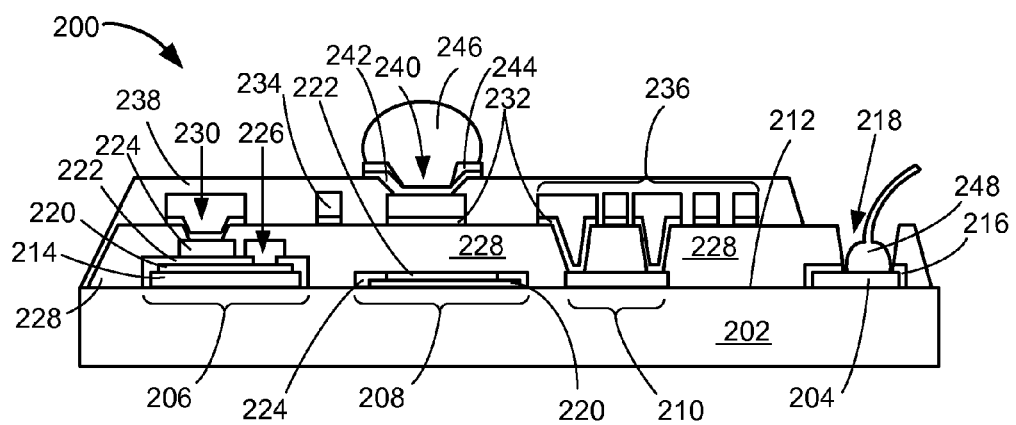
FIG. 2 is a cross-sectional view of an integrated circuit package system in an alternative embodiment of the present invention.

Referring now to FIG. 2, therein is shown a cross-sectional view of an integrated circuit package system 200 in an alternative embodiment of the present invention. The cross-sectional view of the integrated circuit package system 200 includes structural similarities with the integrated circuit package system 100 of FIG. 1.

The cross-sectional view depicts an integrated circuit die 202 having contact pads 204, a first circuit element 206, a second circuit element 208, and a third circuit element 210 provided thereover. For example, the contact pads 204 may function as input/output (IO) pads for the integrated circuit die 202. The first circuit element 206 is depicted as capacitor. The second circuit element 208 is depicted as a resistor. The third circuit element 210 is depicted as conductive trace or a redistribution trace. The contact pads 204, the first circuit element 206, the second circuit element 208, and the third circuit element 210 are preferably over an active side 212 of the integrated circuit die 202.

The contact pads 204 may be preferably formed with a first conductive layer 214, such as aluminum (Al), copper (Cu), gold (Au), or a metal alloy. The first conductive layer 214 is preferably not the first conducting layer of the semiconductor process used to manufacture the integrated circuit die 202. The first conductive layer 214 may be the last conducting layer of the semiconductor process used to manufacture the integrated circuit die 202.

A protection cover 216 preferably partially covers the contact pads 204 and exposes the contact pads 204 through pad openings 218. The protection cover 216 is preferably formed from an insulator layer 222. The protection cover 216 shields the contact pads 204 from further corrosive processing, such as wet etching, and prevents galvanic corrosion of the contact pads 204. Galvanic corrosion adversely affects the contact pads 204 causing pin holes. The insulator layer 222 may be formed by a number of a dielectric layer or film, such as silicon nitride (SiN), tantalum pentoxide ($Ta_2O_5$), or hafnium oxide ($HfO_2$).

The first circuit element 206 preferably includes the first conductive layer 214, a resistive layer 220, the insulator layer 222, and a second conductive layer 224. The resistive layer 220 is preferably a high resistivity material, such as nickel chromium (NiCr) or poly-silicon crystalline (poly-Si). The second conductive layer 224 is preferably aluminum (Al), copper (Cu), a metal alloy, or other conductive film.

The first circuit element 206 preferably has the resistive layer 220 over the first conductive layer 214 which is over the integrated circuit die 202. The insulator layer 222 partially covers the resistive layer 220 and the first conductive layer 214 of the first circuit element 206 and exposes the resistive layer 220 with an insulator opening 226. The second conductive layer 224 is preferably patterned over the insulator layer 222 not over the insulator opening 226 and over the insulator opening 226 connecting with the resistive layer 220.

The second circuit element 208 preferably includes the resistive layer 220, the insulator layer 222, and the second conductive layer 224. The second circuit element 208 preferably has the insulator layer 222 over the resistive layer 220 which is over the integrated circuit die 202. The second conductive layer 224 is patterned over the resistive layer 220 not covered by the insulator layer 222. The second conductive layer 224 is adjacent with and does not cover the insulator layer 222.

The third circuit element 210 preferably includes the second conductive layer 224. The third circuit element 210 is shown not contacting the second circuit element 208 or the resistive layer 220 over the contact pads 204. Also, the first circuit element 206 is shown not contacting the second circuit element 208.

A first passivation layer 228, such as polyimide, benzocyclobutene (BCB), polybenzoxazole (PBO), covers the active side 212 including the second circuit element 208. The first passivation layer 228 partially covers the first circuit element 206, the third circuit element 210, and the contact pads 204. The first passivation layer 228 also provides first openings 230 exposing the contact pads 204, the second conductive layer 224 of the first circuit element 206, and the third circuit element 210. The first passivation layer 228 is used to protect the underlying devices, such as the first circuit element 206 and the second circuit element 208, from penetration of mobile ions, moisture, transition metal (such as gold or silver), and other contaminations.

A third conductive layer 232 is preferably patterned over the first passivation layer 228. The third conductive layer 232 is preferably adjacent to and lining predetermined locations of the first openings 230. The third conductive layer 232 lines the first openings 230 over the first circuit element 206 and the third circuit element 210. The third conductive layer 232 is shown not over the contact pads 204.

The third conductive layer 232 also covers predetermined locations over the first passivation layer 228 not adjacent the first openings 230. The third conductive layer 232 is shown not completely covering the first passivation layer 228. The third conductive layer 232 may be formed from a number of different materials, such as chromium (Cr), tin (Ti), tin tungsten (TiW), tin nitride (TiN), tantalum (Ta), or tantalum nitride (TaN).

A fourth conductive layer 234 is preferably patterned over the third conductive layer 232. The fourth conductive layer 234 and the third conductive layer 232 may preferably provide a number of functions. For example, the first openings 230 lined with the third conductive layer 232 provide electrical vias connecting the fourth conductive layer 234 with the first circuit element 206 and the third circuit element 210.

Another example, the fourth conductive layer 234 over the third circuit element 210 and between the contact pads 204 and the third circuit element 210 may form a fourth circuit element 236, such as an inductor. The third conductive layer 232 and the fourth conductive layer 234 between the first circuit element 206 and the third circuit element 210 may function as redistribution layer.

The first passivation layer 228 serves as a stress buffer or protective coat for the integrated circuit die 202. The first passivation layer 228 also separates the fourth circuit element 236 from the substrate of the integrated circuit die 202 resulting in an increase in the Q value of the inductor.

A second passivation layer 238, such as polyimide, benzocyclobutene (BCB), polybenzoxazole (PBO), partially covers the first passivation layer 228 and the fourth conductive layer 234 with a second opening 240 exposing a portion of the fourth conductive layer 234 over the second circuit element 208. The second passivation layer 238 does not cover the pad openings 218 exposing the contact pads 204.

A fifth conductive layer 242 is preferably patterned over the second passivation layer 238 adjacent to and line the second opening 240. The fifth conductive layer 242 is over the fourth conductive layer 234 exposed in the second opening 240 and not completely covering the second passivation layer 238. The fifth conductive layer 242 may be formed from a number of different materials, such as chromium (Cr), tin (Ti), tin tungsten (TiW), tin nitride (TiN), tantalum (Ta), or tantalum nitride (TaN).

A sixth conductive layer 244 is preferably patterned over the fifth conductive layer 242. The sixth conductive layer 244 may be formed from a number of different materials, such as nickel vanadium (NiV), Cu, Cu/NiV, Au/Ni, or CrCu. The fifth conductive layer 242 and the sixth conductive layer 244 may preferably form the under bump metallization (UBM) for a first interconnect 246, such as sold bump, gold bump, or copper pillar. A second interconnect 248, such as a bond wire or a conductive pillar, is preferably attached to the contact pads 204 through the pad openings 218 in the first passivation layer 228 and the resistive layer 220.

The integrated circuit package system 200 may connect to the next system level (not shown), such as a printed circuit board or another integrated circuit device (not shown). Alternatively, the integrated circuit package system 200 may be further packaged.

Figure 3:
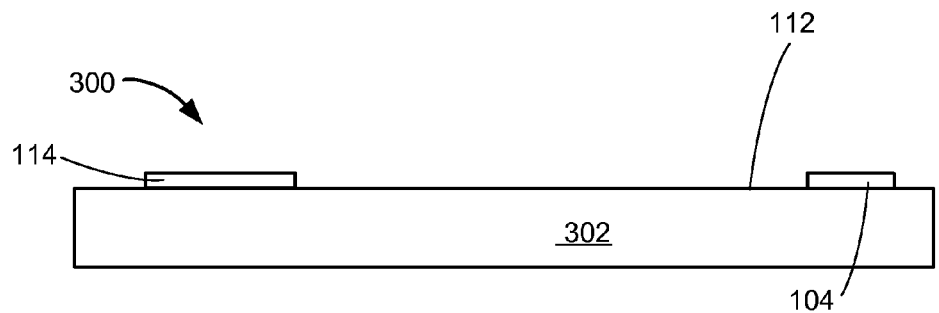
FIG. 3 is a cross-sectional view of a wafer structure in forming the first conductive layer in an embodiment of the present invention.

Referring now to FIG. 3, therein is shown a cross-sectional view of a wafer structure 300 in forming the first conductive layer 114 in an embodiment of the present invention. The wafer structure 300 includes a wafer 302 having the first conductive layer 114 formed thereover. The first conductive layer 114 is patterned over the active side 112 forming the contact pads 104 and one of the electrodes, such as the metal cap, for the first circuit element 106 of FIG. 1.

The first conductive layer 114 is applied over the wafer 302 with a number of different processes, such as depositing, sputtering, or plating. The first conductive layer 114 may be patterned using a number of different processes. For example, the patterning process may preferably be a development process utilizing patterned photoresist structures (not shown) over the first conductive layer 114 and etching. The photoresist is preferably removed for further processing the wafer structure 300.

Figure 4:
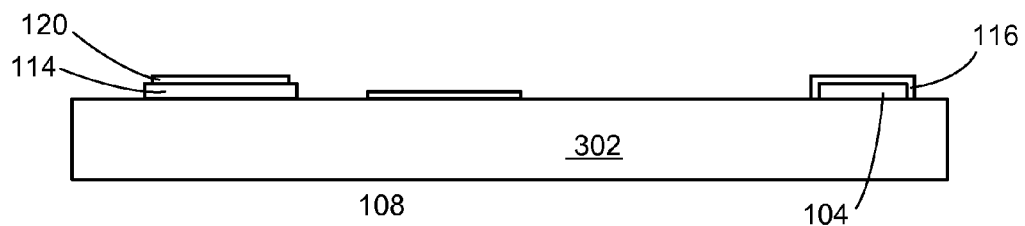
FIG. 4 is the structure of FIG. 3 in forming the resistive layer.

Referring now to FIG. 4, therein is shown the structure of FIG. 3 in forming the resistive layer 120. The resistive layer 120 is preferably deposited over the first conductive layer 114 and the wafer 302. The resistive layer 120 may be patterned using a number of different processes, such as the development process described above utilizing patterned photoresist structures and etching.

The patterning process forms the resistive layer 120 over the first conductive layer 114 of the first circuit element 106 of FIG. 1, the resistive layer 120 of the second circuit element 108 of FIG. 1 over the wafer 302, and the protection cover 116 over the contact pads 104. The resistive layer 120 over the contact pads 104 preferably functions to protect the contact pads 104 from further development, such as wet etching, of the wafer 302 that would be damaging to the contact pads 104.

Figure 5:
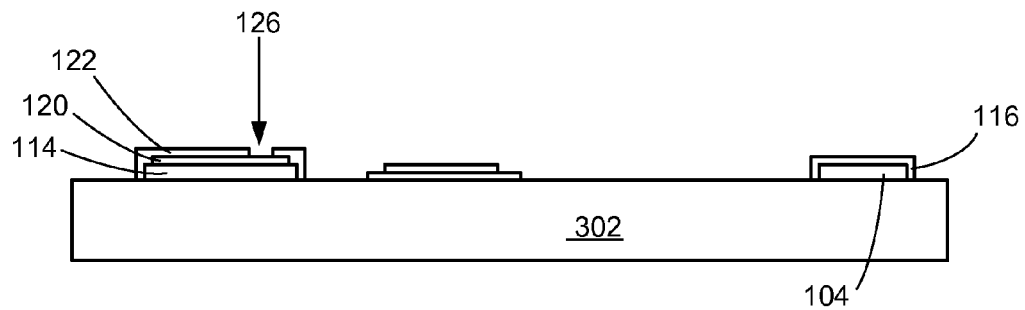
FIG. 5 is the structure of FIG. 4 in forming the insulator layer.

Referring now to FIG. 5, therein is shown the structure of FIG. 4 in forming the insulator layer 122. The insulator layer 122 is preferably deposited over the first conductive layer 114, the resistive layer 120, and the wafer 302. The insulator layer 122 may be patterned using a number of different processes, such as the development process utilizing patterned photoresist structures and etching.

The patterning process forms the insulator layer 122 covering the first conductive layer 114 and partially covering the resistive layer 120 of the first circuit element of FIG. 1. The insulator opening 126 in the insulator layer 122 exposes the resistive layer 120. The patterning process also forms the insulator layer 122 over and not completely covering the resistive layer 120 of the second circuit element 108 of FIG. 1. The protection cover 116 protects the contact pads 104 during the development of the insulator layer 122.

Figure 6:
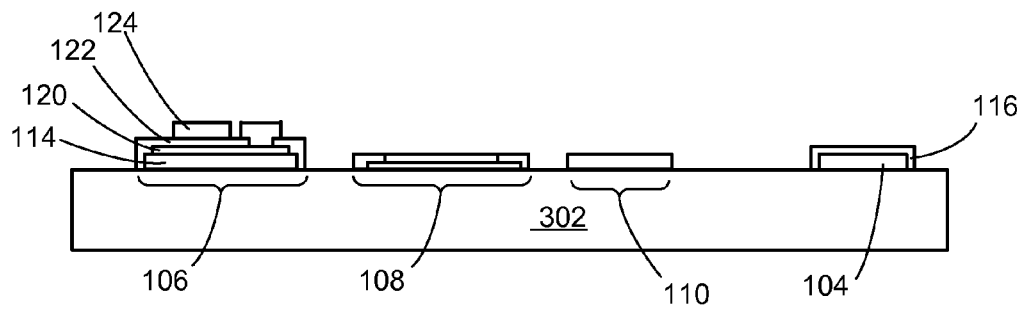
FIG. 6 is the structure of FIG. 5 in forming the second conductive layer.

Referring now to FIG. 6, therein is shown the structure of FIG. 5 in forming the second conductive layer 124. The second conductive layer 124 is preferably deposited over the insulator layer 122, the resistive layer 120, the first conductive layer 114, and the wafer 302. The second conductive layer 124 may be patterned using a number a different processes, such as a development process utilizing patterned photoresist structures and etching.

The patterning process of the second conductive layer 124 forms the first circuit element 106, the second circuit element 108, and the third circuit element 110. The protection cover 116 exposed in the pad openings 118 of FIG. 1 protects the contact pads 104 during the development of the second conductive layer 124.

Figure 7:
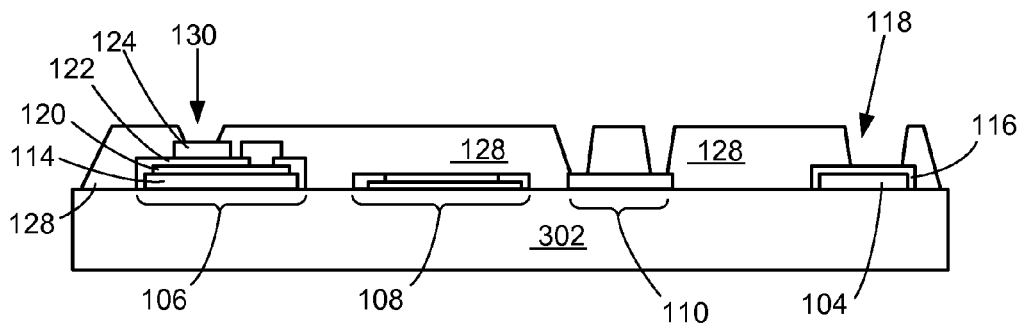
FIG. 7 is the structure of FIG. 6 in forming the first passivation layer.

Referring now to FIG. 7, therein is shown the structure of FIG. 6 in forming the first passivation layer 128. The first passivation layer 128 is preferably deposited over the second conductive layer 124, the insulator layer 122, the resistive layer 120, the first conductive layer 114, and the wafer 302. The first passivation layer 128 may be applied with a number of different processes, such as spin coating. The first passivation layer 128 may be patterned using a number of different processes, such as dry etch, wet etch, or dry etch with laser ablation.

The patterning process of the first passivation layer 128 exposes the second conductive layer 124 of the first circuit element 106, the third circuit element 110 and the resistive layer 120 over the contact pads 104. The patterning process forms the first openings 130 and the pad openings 118 in the first passivation layer 128. The protection cover 116 exposed in the pad openings 118 protects the contact pads 104 during the development of the first passivation layer 128.

Figure 8:
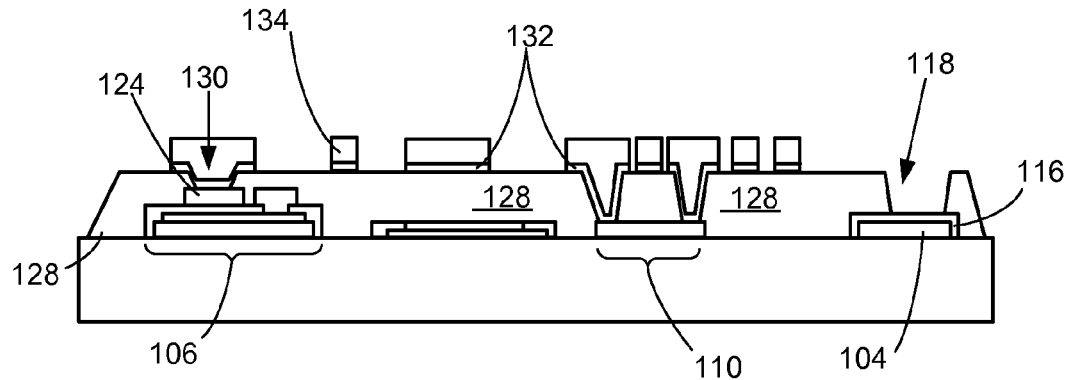
FIG. 8 is the structure of FIG. 7 in forming the fourth conductive layer.

Referring now to FIG. 8, therein is shown the structure of FIG. 7 in forming the fourth conductive layer 134. The third conductive layer 132 is preferably deposited over the first passivation layer 128 and the second conductive layer 124 exposed by the first openings 130.

The third conductive layer 132 is preferably patterned adjacent to and lining predetermined locations of the first openings 130. The third conductive layer 132 lines the first openings 130 over the first circuit element 106 and the third circuit element 110. The third conductive layer 132 is shown not over the contact pads 104.

The third conductive layer 132 may be applied over the first passivation layer 128 and the first openings 130 exposing the second conductive layer 124 with a number of different processes, such as depositing, sputtering, or plating. The third conductive layer 132 is also preferably patterned over predetermined locations over the first passivation layer 128 not adjacent the first openings 130. The third conductive layer 132 is shown not completely covering the first passivation layer 128.

The third conductive layer 132 may be patterned using a number of different processes. For example, the patterning process may preferably be a development process utilizing patterned photoresist structures (not shown) over the third conductive layer 132 and wet etching.

The fourth conductive layer 134 may be applied over the third conductive layer 132 and the first passivation layer 128 and with a number of different processes, such as depositing, sputtering, or plating. The fourth conductive layer 134 is also preferably patterned over predetermined locations over the third conductive layer 132. The protection cover 116 exposed in the pad openings 118 protects the contact pads 104 during the development of the third conductive layer 132 and the fourth conductive layer 134.

Figure 9:
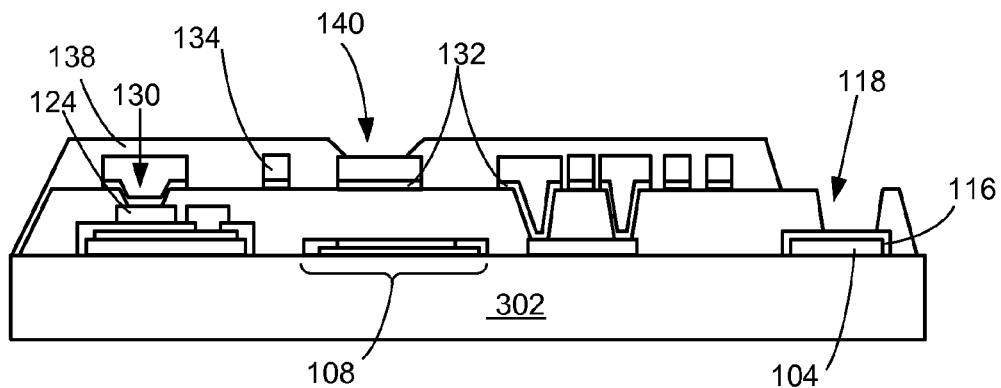
FIG. 9 is the structure of FIG. 8 in forming the second passivation layer.

Referring now to FIG. 9, therein is shown the structure of FIG. 8 in forming the second passivation layer 138. The second passivation layer 138 is preferably deposited over the fourth conductive layer 134, the third conductive layer 132, and the wafer 302. The second passivation layer 138 may be applied with a number of different processes, such as depositing or spin coating. The second passivation layer 138 may be patterned using a number of different processes, such as dry etch, wet etch, or dry etch with laser ablation.

The patterning process of the second passivation layer 138 exposes the fourth conductive layer 134 with the second opening 140 over the second circuit element 108. The second passivation layer 138 may optionally partially fill the pad openings 118 or may not occupy the pad openings 118. The protection cover 116 exposed in the pad openings 118 protects the contact pads 104 during the development of the second passivation layer 138. The protection cover 116 exposed in the pad openings 118 may be optionally removed for connecting the second interconnect 148 of FIG. 1, such as bond wire, to both the contact pads 104 and to the fourth conductive layer 134 exposed by the second passivation layer 138.

Figure 10:
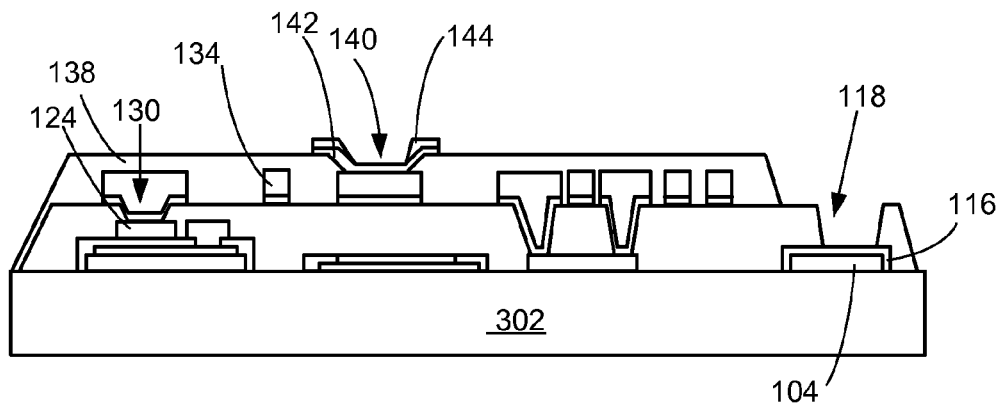
FIG. 10 is the structure of FIG. 9 in forming the sixth conductive layer.

Referring now to FIG. 10, therein is shown the structure of FIG. 9 in forming the sixth conductive layer 144. The fifth conductive layer 142 may be applied over the second passivation layer 138 and the fourth conductive layer 134 exposed in the second opening 140 with a number of different processes, such as depositing, sputtering, or plating. The fifth conductive layer 142 is preferably patterned over the second passivation layer 138 adjacent to and line the second opening 140. The fifth conductive layer 142 is over the fourth conductive layer 134 exposed in the second opening 140 and not completely covering the second passivation layer 138.

The sixth conductive layer 144 may be applied over the second passivation layer 138 and the fifth conductive layer 142. The sixth conductive layer 144 is preferably patterned over the fifth conductive layer 142 and not completely covering the second passivation layer 138. The protection cover 116 exposed in the pad openings 118 protects the contact pads 104 during the development of the fifth conductive layer 142 and the sixth conductive layer 144. For illustrative purposes, the development of the fifth conductive layer 142 and the sixth conductive layer 144 are described individually, although it is understood that both the fifth conductive layer 142 and the sixth conductive layer 144 may be applied over the wafer 302 and may be patterned in a single development step.

Figure 11:
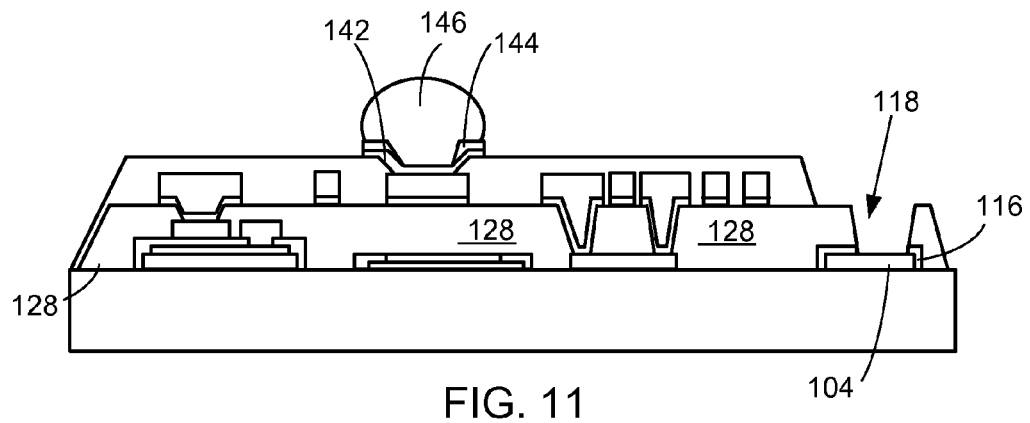
FIG. 11 is the structure of FIG. 10 in forming the first interconnect.

Referring now to FIG. 11, therein is shown the structure of FIG. 10 in forming the first interconnect 146. The fifth conductive layer 142 and the sixth conductive layer 144 preferably form the under bump metallization (UBM) for the first interconnect 146. The protection cover 116 exposed in the pad openings 118 protects the contact pads 104 from contamination, such as during the reflow and the flux stripping for the first interconnect 146.

The protection cover 116 exposed in the pad openings 118 is preferably removed exposing the contact pads 104. The protection cover 116 in the pad openings 118 may be removed in a number of different ways. For example, the protection cover 116 possesses a good etch selectivity compared to the first passivation layer 128 with reactive ion etch (RIE).

The protection cover 116 covering the contact pads 104 that are not exposed in the pad openings 118 continue to cover the contact pads 104. For illustrative purposes, the formation of the first interconnect 146 is described with the protection cover 116 exposed in the pad openings 118, although it is understood that the protection cover 116 in the pad openings 118 may be removed and the first interconnect 146 may be formed over both the sixth conductive layer 144 and the contact pads 104.

Figure 12:
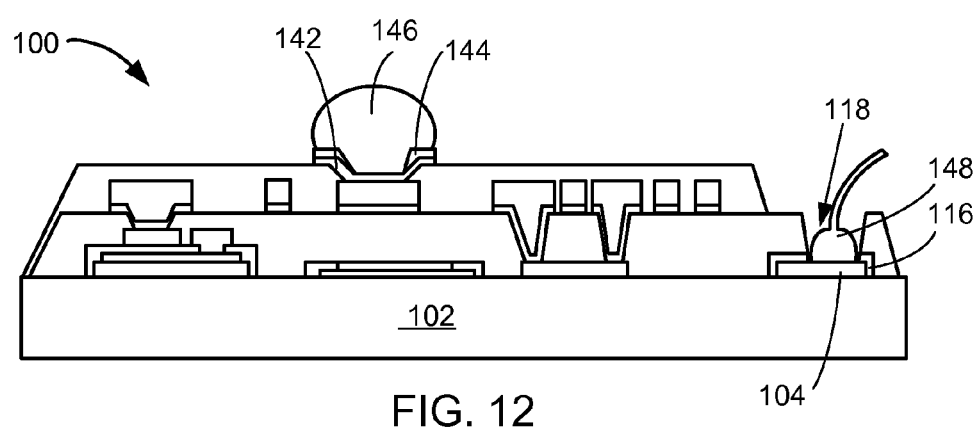
FIG. 12 is the structure of FIG. 11 in forming the second interconnect.

Referring now to FIG. 12, therein is shown the structure of FIG. 11 in forming the second interconnect 148. The integrated circuit die 102 may be singulated from the wafer 302. The second interconnect 148 preferably attaches to the contact pads 104 exposed in the pad openings 118 forming the integrated circuit package system 100. The protection cover 116 over the contact pads 104 prevents contamination and Galvanic corrosion of the contact pads 104 from the processes described above.

For illustrative purposes, the protection cover 116 exposed in the pad openings 118 is described as removed, although it is understood that the protection cover 116 exposed in the pad openings 118 may not be removed. Also for illustrative purposes, the protection cover 116 exposed in the pad openings 118 is described as removed, although it is understood that a predetermined number and locations of the contact pads 104 may be exposed with the protection cover 116 removed. For example, a predetermined number and locations of the contact pads 104 may be connected for programming purpose or bonding option.

Further for illustrative purposes, the wafer 302 is described as singulated for forming the integrated circuit package system 100, although it is understood that the wafer 302 may represent a wafer scale chip. For example, the structure described in FIG. 8, FIG. 10, or FIG. 11 may represent the integrated circuit package system 100.

Figure 13:
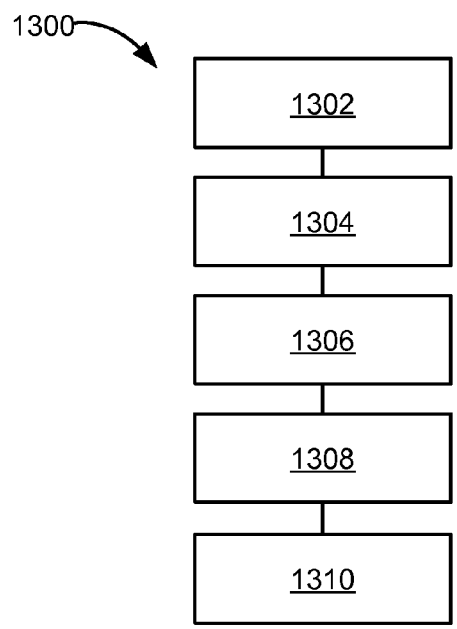
FIG. 13 is a flow chart of an integrated circuit package system for manufacture of the integrated circuit package system in an embodiment of the present invention.

Referring now to FIG. 13, therein is shown a flow chart of an integrated circuit package system 1300 for manufacture of the integrated circuit package system 100 in an embodiment of the present invention. The system 1300 includes providing an integrated circuit die having a contact pad in a block 1302; forming a protection cover over the contact pad in a block 1304; forming a passivation layer having a first opening over the protection cover with the first opening exposing the protection cover in a block 1306; developing a conductive layer over the passivation layer in a block 1308; and forming a pad opening in the protection cover for exposing the contact pad in a block 1310.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacture of an integrated circuit package system comprising:
   providing an integrated circuit die having a contact pad;
   forming a protection cover over the contact pad;
   forming a passivation layer having a first opening over the protection cover with the first opening exposing the protection cover;
   developing a conductive layer over the passivation layer;
   forming a pad opening in the protection cover for exposing the contact pad having the conductive layer partially removed; and
   forming an interconnect directly on the contact pad and only adjacent to the protection cover and the passivation layer.

2. The method as claimed in claim 1 further comprising forming a circuit element over the integrated circuit die.

3. The method as claimed in claim 1 wherein forming the pad opening in the protection cover includes providing the protection cover having a higher etching selectivity compared to the passivation layer.

4. The method as claimed in claim 1 wherein forming the protection cover over the contact pad includes protecting the contact pad from chemicals used for developing the conductive layer.

5. The method as claimed in claim 1 further comprising forming an interconnect over the conductive layer and the contact pad exposed in the pad opening.

6. A method for manufacture of an integrated circuit package system comprising:
   providing an integrated circuit die having a contact pad;
   forming a protection cover over the contact pad;
   forming a passivation layer having a first opening over the protection cover with the first opening exposing the protection cover;
   developing a conductive layer over the passivation layer with the protection cover protecting the contact pad from chemicals used for developing the conductive layer;
   forming a first interconnect over the conductive layer;
   forming a pad opening in the protection cover for exposing the contact pad; and
   forming a second interconnect directly on the contact pad and only adjacent to the protection cover and the passivation layer.

7. The method as claimed in claim 6 wherein forming the protection cover over the contact pad includes forming the protection cover comprised of a resistive layer having a lower etching selectivity than the conductive layer.

8. The method as claimed in claim 6 wherein forming the protection cover over the contact pad includes forming the protection cover comprised of an insulator layer having a lower etching selectivity than the conductive layer.

9. The method as claimed in claim 6 wherein forming the pad opening in the protection cover includes the protection cover having a higher etching selectivity than the passivation layer.

10. The method as claimed in claim 6 wherein developing the conductive layer includes etching the conductive layer.

* * * * *